US 9,287,389 B2

(12) United States Patent
Kizilyalli et al.

(10) Patent No.: US 9,287,389 B2
(45) Date of Patent: *Mar. 15, 2016

(54) METHOD AND SYSTEM FOR DOPING CONTROL IN GALLIUM NITRIDE BASED DEVICES

(71) Applicant: Avogy, Inc., San Jose, CA (US)

(72) Inventors: Isik C. Kizilyalli, San Francisco, CA (US); Hui Nie, Cupertino, CA (US); Andrew P. Edwards, San Jose, CA (US); Linda Romano, Sunnyvale, CA (US); David P. Bour, Cupertino, CA (US); Richard J. Brown, Los Gatos, CA (US); Thomas R. Prunty, Santa Clara, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/611,041

(22) Filed: Jan. 30, 2015

(65) Prior Publication Data

US 2015/0155372 A1 Jun. 4, 2015

Related U.S. Application Data

(63) Continuation of application No. 13/198,661, filed on Aug. 4, 2011, now Pat. No. 8,946,788.

(51) Int. Cl.
*H01L 29/20* (2006.01)
*H01L 29/772* (2006.01)
(Continued)

(52) U.S. Cl.
CPC ...... *H01L 29/66909* (2013.01); *H01L 21/0254* (2013.01); *H01L 21/0262* (2013.01);
(Continued)

(58) Field of Classification Search
CPC .............. H01L 29/207; H01L 29/1066; H01L 29/2003; H01L 29/6689–29/66924; H01L 29/808; H01L 29/8083
See application file for complete search history.

(56) References Cited

U.S. PATENT DOCUMENTS

| 6,645,785 B2 | 11/2003 | Koike et al. |
| 6,830,948 B2 | 12/2004 | Koike et al. |

(Continued)

FOREIGN PATENT DOCUMENTS

| JP | 410107319 A | 4/1998 |
| WO | WO 2013/019521 A1 | 2/2013 |

OTHER PUBLICATIONS

Chung et al., "*Electrical characterization of isoelectronic In-doping effects in GaN films grown by metalorganic vapor phase epitaxy*" Applied Physics Letters vol. 76 No. 7 (2000), pp. 897-898.

(Continued)

*Primary Examiner* — Matthew Landau
*Assistant Examiner* — Eric Ward
(74) *Attorney, Agent, or Firm* — Kilpatrick Townsend & Stockton LLP

(57) ABSTRACT

A method of growing a III-nitride-based epitaxial structure is disclosed. The method includes forming a GaN-based drift layer coupled to the GaN-based substrate, where forming the GaN-based drift layer comprises doping the drift layer with indium to cause the indium concentration of the drift layer to be less than about $1 \times 10^{16}$ cm$^{-3}$ and to cause the carbon concentration of the drift layer to be less than about $1 \times 10^{16}$ cm$^{-3}$. The method also includes forming an n-type channel layer coupled to the GaN-based drift layer, forming an n-contact layer coupled to the GaN-based drift layer, and forming a second electrical contact electrically coupled to the n-contact layer.

20 Claims, 5 Drawing Sheets

(51) Int. Cl.
  *H01L 21/20* (2006.01)
  *H01L 29/66* (2006.01)
  *H01L 21/02* (2006.01)
  *H01L 29/808* (2006.01)
  *H01L 29/872* (2006.01)
  *H01L 29/10* (2006.01)

(52) U.S. Cl.
  CPC .... *H01L21/02538* (2013.01); *H01L 21/02573* (2013.01); *H01L 29/1066* (2013.01); *H01L 29/66212* (2013.01); *H01L 29/66893* (2013.01); *H01L 29/66924* (2013.01); *H01L 29/8083* (2013.01); *H01L 29/872* (2013.01); *H01L 29/2003* (2013.01)

(56) References Cited

U.S. PATENT DOCUMENTS

| | | | |
|---|---|---|---|
| 7,186,302 | B2 | 3/2007 | Chakraborty et al. |
| 7,825,434 | B2 | 11/2010 | Ueno et al. |
| 7,977,713 | B2 | 7/2011 | Sankin et al. |
| 8,569,153 | B2 | 10/2013 | Bour et al. |
| 8,946,788 | B2 | 2/2015 | Kizilyalli et al. |
| 2006/0079090 | A1 | 4/2006 | Elers et al. |
| 2008/0142811 | A1 | 6/2008 | Matocha et al. |
| 2008/0251801 | A1 | 10/2008 | Ueno et al. |
| 2009/0032828 | A1 | 2/2009 | Romano et al. |
| 2009/0189190 | A1 | 7/2009 | Hashimoto et al. |
| 2010/0148186 | A1 | 6/2010 | Sheridan et al. |
| 2010/0244087 | A1 | 9/2010 | Horie et al. |
| 2011/0001142 | A1 | 1/2011 | Saitoh |
| 2011/0114916 | A1 | 5/2011 | Yoshizumi et al. |
| 2012/0248577 | A1 | 10/2012 | Romano et al. |

OTHER PUBLICATIONS

Lyons et al., "*Carbon impurities and the yellow luminescence in GaN*", Applied Physics Letters 97, 152108, Oct. 13, 2010, 3 pages.
Notification of Transmittal of the International Search Report and the Written Opinion of the International Searching Authority, or the Declaration and International Search Report and Written Opinion of the International Searching Authority for International Application No. PCT/US2012/048194 mailed on Nov. 20, 2012, 11 pages.
Seager et al., "*Role of carbon in GaN*", Journal of Applied Physics, vol. 92 No. 11, p. 6553-6560, Dec. 1, 2002.
Shu et al., "*Isoelectronic In-doping effect in GaN films grown by metalorganic chemical vapor deposition*", Applied Physics Letters vol. 73, No. 5 (1998), pp. 641-643.
Yoon et al., "*Indium Doping Effects on GaN Epilayers Grown by Metal-Organic Chemical Vapor Deposition*", Journal of the Korean Physical Society, vol. 42 (Feb. 2003), pp. S438-S440.
Yuan et al., "*Indium Doping Effect on GaN in the Initial Growth Stage*", Journal of Electronic Materials, vol. 30, No. 8 (2001), pp. 977-979.
Non-Final Office Action for U.S. Appl. No. 13/198,661 mailed on Sep. 26, 2013, 13 pages.
Final Office Action for U.S. Appl. No. 13/198,661 mailed on Jan. 28, 2014, 18 pages.
Non-Final Office Action for U.S. Appl. No. 13/198,661 mailed on May 12, 2014, 15 pages.
Final Office Action for U.S. Appl. No. 13/198,661 mailed on Aug. 21, 2014, 16 pages.
Notice of Allowance for U.S. Appl. No. 13/198,661 mailed on Dec. 17, 2014, 7 pages.

METHOD AND SYSTEM FOR DOPING CONTROL IN GALLIUM NITRIDE BASED DEVICES

CROSS-REFERENCES TO RELATED APPLICATIONS

This application is a continuation of U.S. patent application Ser. No. 13/198,661, filed on Aug. 4, 2011, the disclosure of which is incorporated by reference herein in its entirety for all purposes.

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to methods and systems for controlling dopant density in semiconductor devices. Merely by way of example, the invention has been applied to methods and systems for controlling doping in high voltage GaN devices with vertical drift regions. The methods and techniques can be applied to a variety of compound semiconductor systems including transistors, diodes, thyristors, and the like.

Embodiments of the present invention reduce background carbon incorporation in epitaxial films, enabling the epitaxial growth of thick vertical drift layers characterized by low dopant concentrations and high breakdown voltages. As described below, the ability to reduce the background level of carbon concentration enables increased precision in the control of dopant concentration at low concentration levels, which enables high levels of device performance.

According to an embodiment of the present invention, a method of growing a III-nitride-based epitaxial structure is provided. The method includes providing a substrate in an epitaxial growth reactor and heating the substrate to a predetermined temperature. The method also includes flowing a gallium-containing gas into the epitaxial growth reactor and flowing a nitrogen-containing gas into the epitaxial growth reactor. The method further includes flowing a gettering gas into the epitaxial growth reactor. The predetermined temperature is greater than 1000° C.

According to another embodiment of the present invention, a method of operating a high voltage device is provided. The method includes providing a GaN-based substrate, a drift layer coupled to the GaN-based substrate, and a contact region coupled to the drift layer. The drift layer is characterized by a doping density of a p-type dopant less than $1 \times 10^{16}$ cm$^{-3}$. The method also includes applying an electrical bias between the GaN-based substrate and the contact region and conducting current through the drift layer.

According to a specific embodiment of the present invention, a vertical JFET is provided. The vertical JFET includes an n-type GaN-based substrate having a surface and a first electrical contact opposing the surface and an n-type drift layer coupled to the GaN-based substrate and operable to conduct current in a direction substantially orthogonal to the surface. A concentration of carbon in the n-type drift layer is less than $1 \times 10^{16}$ cm$^{-3}$. The vertical JFET also includes an n-type channel layer coupled to the n-type drift layer and an n-contact layer coupled to the n-type drift layer and substantially parallel to the surface. The vertical JFET further includes a second electrical contact electrically coupled to the n-contact layer, a p-type gate region electrically coupled to the n-type channel layer, and a third electrical contact electrically coupled to the p-type gate region.

According to another specific embodiment of the present invention, a method of growing a III-nitride epitaxial layer is provided. The method includes placing a GaN-based substrate in an MOCVD reactor and heating the GaN-based substrate to a temperature greater than 1000° C. The method also includes flowing a gas containing nitrogen into the MOCVD reactor, flowing a gas containing gallium into the MOCVD reactor, and flowing a gas containing indium into the MOCVD reactor. The method further includes growing the III-nitride layer incorporating gallium, indium, and nitrogen.

Numerous benefits are achieved by way of the present invention over conventional techniques. For example, embodiments of the present invention provide vertical device geometries that conserve valuable wafer area, since the portion of the device that support high voltages (e.g., the drift region of a transistor), is based on the vertical thickness of an epitaxially grown layer, not by the horizontal extent of the device. Embodiments of the present invention provide homoepitaxial GaN layers on bulk GaN substrates that are imbued with superior properties to other materials used for power electronic devices. High electron mobility, µ, is associated with a given background doping level, N, which results in low resistivity, ρ, since $\rho = 1/q\mu N$.

Another beneficial property provided by embodiments of the present invention is a high critical electric field, $E_{crit}$, for avalanche breakdown. A high critical electric field allows large voltages to be supported over a smaller length, L, than a material with lesser $E_{crit}$. A shorter distance for current to flow and a low resistivity give rise to a lower resistance, R, than conventional high voltage devices since $R = \rho L/A$, where A is the cross-sectional area of the channel, or current path. For a high voltage device with the drift region oriented vertically, more unit cells can be packed into an area of the wafer than a lateral device of the same voltage rating. More unit cells lead to increased width of the current path, and thus larger cross-sectional area, which reduces resistance in the channel. In addition, GaN layers grown on bulk GaN substrates have low defect density compared to layers grown on mismatched substrates. The low defect density results in superior thermal conductivity, less trap related effects such as dynamic on-resistance, lower leakage currents, and increased reliability.

The ability to obtain regions that can support high voltage with low resistance compared to similar device structures in other materials allows embodiments of the present invention to provide resistance properties and voltage capability of conventional devices, while using significantly less area for the GaN device. Capacitance, C, scales with area, approximated as $C = \in A/t$, so the smaller device will have less terminal-to-terminal capacitance. Lower capacitance leads to faster switching and less switching power loss.

As described below, the ability to create a vertical device in GaN grown on bulk GaN substrates will enable a smaller active area device with the same voltage handling capability and same on-state resistance as a larger device in conventional material systems. Conversely, a device of the same size will possess lower on-state resistance with the same voltage blocking capability and capacitance.

These and other embodiments of the invention along with many of its advantages and features are described in more detail in conjunction with the text below and attached figures.

DETAILED DESCRIPTION OF SPECIFIC EMBODIMENTS

Figure 1:
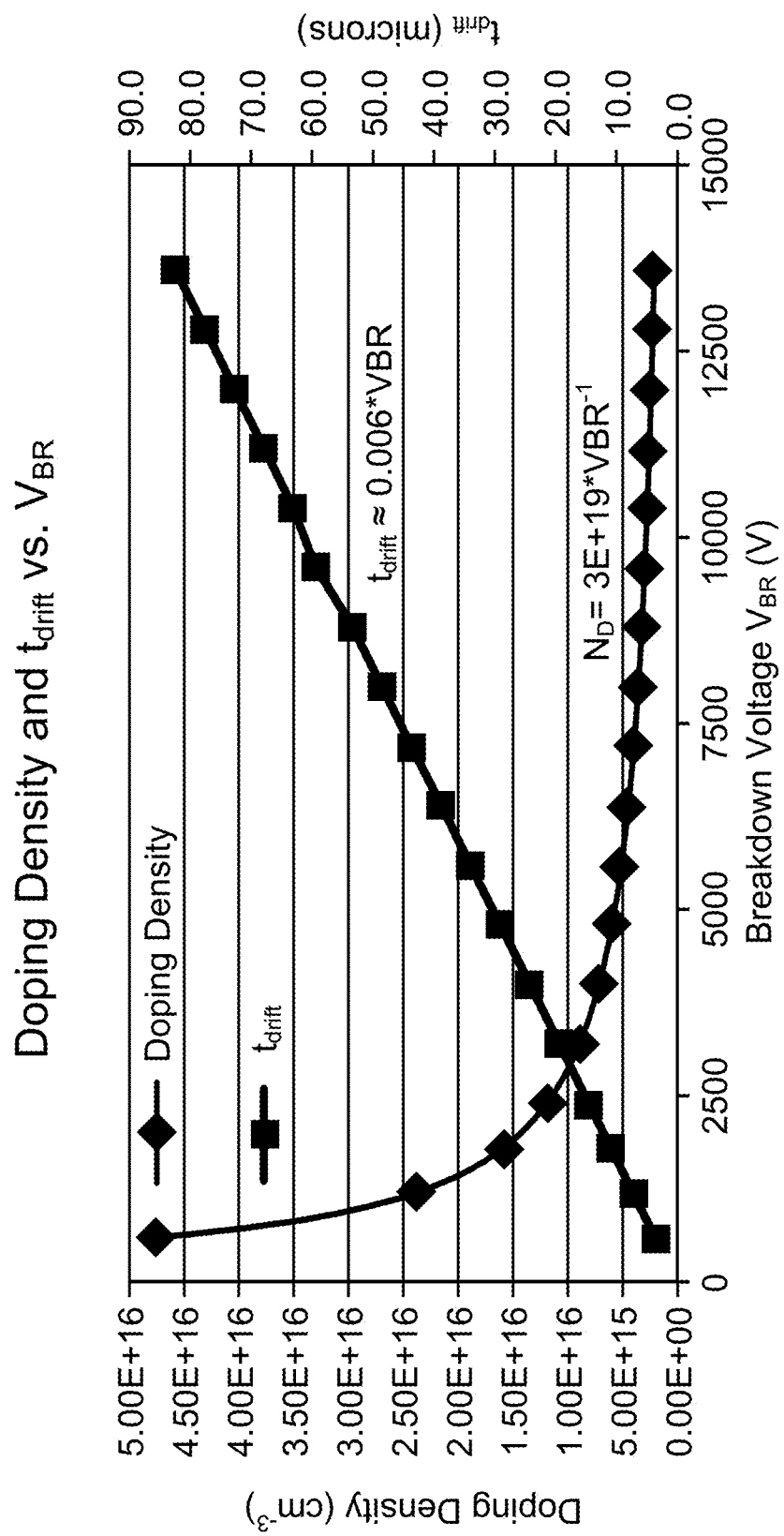
FIG. 1 is a simplified plot illustrating doping concentration and drift layer thickness as a function of breakdown voltage according to an embodiment of the present invention.

Embodiments of the present invention relate to electronic devices. More specifically, the present invention relates to methods and systems for controlling dopant density in semiconductor devices. Merely by way of example, the invention has been applied to methods and systems for controlling doping in high voltage GaN devices with vertical drift regions. The methods and techniques can be applied to a variety of compound semiconductor systems including transistors, diodes, thyristors, and the like.

As described more fully throughout the present specification, the fabrication of GaN epitaxial layer(s) on GaN-based substrates, including pseudo-bulk GaN substrates, enables vertical device concepts in the GaN material system according to embodiments of the present invention. Devices operated in high voltage regimes, typically referred to as high voltage devices, are provided with doping control for the drift region according to embodiments of the present invention such that relatively low volumetric levels of dopants are achieved. Since the maximum electric field is a function of the doping profile, embodiments described herein are able to operate at higher voltages than conventional devices. Embodiments utilize low strain films that are grown on native substrates and are therefore, characterized by reduced or zero lattice mismatch. Such layers can be grown to thicknesses not generally available using conventional techniques, enabling high power operation in vertical configurations. As described herein, GaN material properties enable thinner drift regions for a given voltage rating and are characterized by a high carrier mobility compared to other materials.

Although some embodiments are discussed in terms of GaN substrates and GaN epitaxial layers, the present invention is not limited to these particular binary III-V materials and is applicable to a broader class of III-V materials, in particular III-nitride materials. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. Additionally, other III-nitride materials in addition to GaN are included within the scope of the present invention, including, but not limited to, other binary III-nitride materials, ternary III-nitride materials, such as InGaN and AlGaN, quaternary III-nitride materials, such as AlInGaN, doped versions of these materials, and the like. The substrates discussed herein can include a single material system or multiple material systems including composite structures of multiple layers. One of ordinary skill in the art would recognize many variations, modifications, and alternatives.

Applications that can utilize the vertical drift regions described herein are many, with commercial markets including high voltage switched mode power supplies, power factor correction devices, dc-ac inverters, dc-dc boost converters, various other circuit topologies, and the like. The inventors have determined that devices fabricated utilizing the methods and systems described herein have the potential to provide benefits and performance not available using conventional solutions, including solutions based on SiC technology.

High quality GaN grown on native substrates can be characterized by a low defect density ($<10^6$ cm$^{-3}$) and a related high electron mobility, resulting in low forward conduction loss. Due to the high critical electric field of GaN, drift regions may be kept relatively thin, while blocking high voltages, which will also allow low forward conduction loss. For a given doping level, the drift layer thickness is preferably large enough to accommodate the full depletion width at the breakdown voltage ($V_{BR}$). According to some embodiments, the drift region is lightly doped (e.g., on the order of $1 \times 10^{14}$ to $1 \times 10^{18}$ cm$^{-3}$) and the thickness of the drift region measured along the direction of current flow is reduced to minimize unnecessary series resistance.

Embodiments of the present invention provide methods and systems that relate to basic building blocks useful in vertical, high voltage devices fabricated using GaN-based material systems. These building blocks include, but are not limited to, layer thicknesses, concentrations of donor and/or acceptor dopants, and the like. Merely by way of example, the doping concentration and thickness of a drift layer in a vertical transistor or other device employing a drift region are controlled using the embodiments described herein.

The inventors have determined that designs for vertical drift layers, which can range in thickness from one or several microns to over one hundred microns, benefit from precise control over the concentration of dopants (i.e. doping concentration) in these vertical drift layers, particularly in high voltage applications.

FIG. 1 is a simplified plot illustrating dopant concentration and drift layer thickness ($t_{drift}$) (also referred to as a depletion width) as a function of breakdown voltage according to an embodiment of the present invention. In the plot shown in FIG. 1, the dopant concentration for an n-type dopant is illustrated as a function of the breakdown voltage. For the dopant concentration curve, the thickness of the drift layer is optimized for minimum drift region resistance. As an example, in order to achieve breakdown voltages over ~2500 V, a doping concentration below about $1 \times 10^{16}$ cm$^{-3}$ is utilized for a thickness optimized for minimum drift region resistance. As another example, to achieve a breakdown voltage of ~5,000 V, a doping less than or equal to about $5 \times 10^{15}$ cm$^{-3}$ is utilized In a similar manner, for the drift layer thickness curve, the dopant concentration is optimized for minimum drift region resistance. As discussed below, such doping concentrations are not available using conventional epitaxial growth techniques that are characterized by background carbon doping densities greater than equal to ~2-3×10$^{16}$ cm$^{-3}$, thus limiting the breakdown voltage.

Referring to FIG. 1, the thickness of the drift layer ($t_{drift}$) relative to the breakdown voltage ($V_{BR}$) can be approximated by $t_{drift} \approx V_{BR}*6/1000$, while the doping concentration can be approximated by an inverse power law as doping concentration $\approx 3 \times 10^{19}$ cm$^{-3}/V_{BR}$. It should be noted, referring to FIG. 1, that the breakdown voltage can be increased for a given doping concentration at the expense of the drift region resistance. Thus, the curves illustrated in FIG. 1 are merely exemplary and other suitable curves can be computed utilizing non-optimal drift region resistance.

Table 1 lists doping concentrations and depletion widths of the drift region for breakdown voltages from 600 V to 13.6 kV.

TABLE 1

| $V_{BR}$ (V) | Doping Concentration (cm$^{-3}$) | $t_{drift}$ (μm) |
|---|---|---|
| 600 | 4.75E+16 | 3.7 |
| 1200 | 2.38E+16 | 7.3 |
| 1800 | 1.59E+16 | 10.9 |
| 2400 | 1.19E+16 | 14.6 |
| 3200 | 8.94E+15 | 19.4 |
| 4000 | 7.16E+15 | 24.2 |
| 4800 | 5.96E+15 | 29.1 |
| 5600 | 5.10E+15 | 34.0 |
| 6400 | 4.47E+15 | 38.8 |
| 7200 | 3.97E+15 | 43.7 |
| 8000 | 3.58E+15 | 48.5 |
| 8800 | 3.25E+15 | 53.4 |
| 9600 | 2.92E+15 | 59.4 |
| 10400 | 2.75E+15 | 63.1 |
| 11200 | 2.56E+15 | 67.9 |
| 12000 | 2.38E+15 | 72.8 |
| 12800 | 2.24E+15 | 77.6 |
| 13600 | 2.10E+15 | 82.5 |

Figure 2:
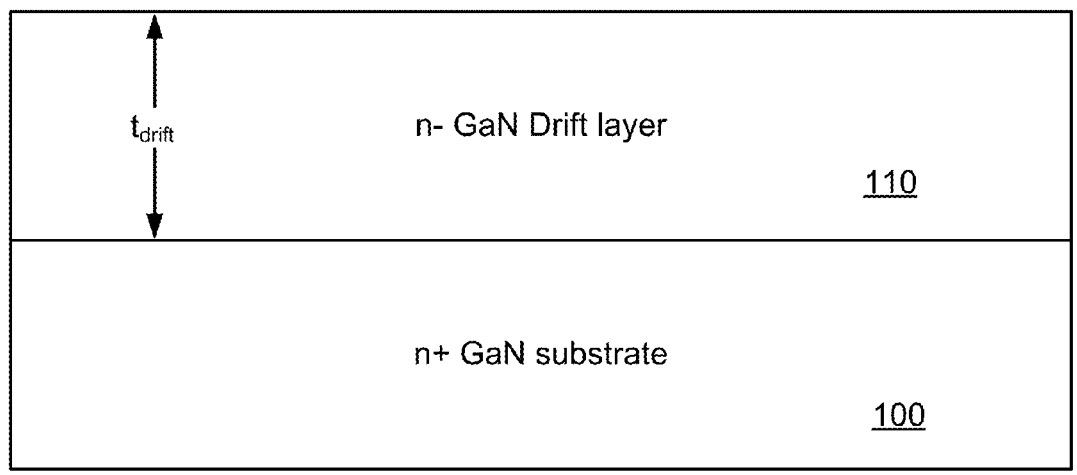
FIG. 2 is a simplified schematic diagram of an epitaxial structure suitable to high voltage vertical operation according to an embodiment of the present invention.

FIG. 2 is a simplified schematic diagram of an epitaxial structure suitable to high voltage vertical operation according to an embodiment of the present invention. As illustrated in the cross section shown in FIG. 2, an n+ GaN substrate 100 supports a lightly doped GaN drift layer 110. In an embodiment, the n+GaN substrate 100 is heavily doped, for example at a doping concentration greater than 1×10$^{18}$ cm$^{-3}$ with donors and the lightly doped GaN drift layer is doped in the range of 1×10$^{14}$ to 1×10$^{18}$ cm$^{-3}$ with donors. The thickness of the drift layer varies depending on the particular application, for example, thicknesses ranging from about 1 μm to about 100 μm. Of course, these doping levels and thicknesses are only provided as examples and the present invention is not limited to these particular values. The doping profile in the drift region could be non-uniform and need not be limited to a single uniform level. As noted above, the GaN drift layer is merely exemplary and is only intended to illustrate an example III-nitride epitaxial layer, which can include ternary and quaternary layers or combinations thereof that are included within the scope of the present invention. Accordingly, the GaN substrate and GaN drift layer illustrated in FIG. 2 can be referred to as GaN-based structures since they are exemplary of more generic III-nitride substrates and epitaxial layers.

In the embodiment illustrated in FIG. 2, an n-type GaN drift layer is grown on top of an n+ GaN substrate. However, the present invention is not limited to this particular epitaxial structure and other structures with controlled doping levels are included within the scope of the present invention. It will be noted that many high voltage vertical electronic devices, including GaN device structures, can be formed using the epitaxial configuration of a GaN substrate and drift layer as illustrated in FIG. 2.

As shown in FIG. 1 and Table 1, the drift layer thickness and doping control are important parameters, the control of which is important in realizing high voltage operation. In conventional high-power GaN devices, a doping level of approximately 3×10$^{16}$ cm$^{-3}$ has been associated with a dopant concentration below which the doping level is not controllable. As will be evident to one of skill in the art, the epitaxial growth of GaN structures utilizes ammonia as a precursor gas that is cracked to provide nitrogen. Additionally, metalorganic precursors are utilized to provide the Group III elements incorporated into the III-nitride epitaxial structure.

The most common epitaxial growth methods are metal organic chemical vapor deposition (MOCVD), metal organic vapor phase epitaxy, and metal organic molecular beam epitaxy. During the epitaxy process, metalorganic precursors are typically used and carbon produced from the metalorganic precursors, for example, trimethyl gallium, triethyl gallium, trimethyl aluminum, triethyl aluminum, or the like, can be unintentionally incorporated into the GaN-based crystal lattice, providing deep level traps that pin the Fermi level to the energy associated with these deep level traps. When carbon is incorporated into the GaN-based drift layer during the drift layer epitaxial process, the carbon incorporation can cause p-type background doping levels of, for example, between 1×10$^{16}$ cm$^{-3}$ and 1×10$^{18}$ cm$^{-3}$, particularly 3×10$^{16}$ cm$^{-3}$. The unintended background doping neutralizes intentional n-type doping (e.g., silicon doping) introduced during drift layer epitaxial growth, making it difficult to achieve the n-type dopant concentrations shown in FIG. 1 and Table 1.

Embodiments of the present invention reduce the background doping density in GaN-based epitaxial layers including a drift layer, for example, resulting from carbon incorporation, to enable controllable low levels of dopant concentration. According to embodiments of the present invention, one or more gettering materials are utilized during the epitaxial growth process to reduce the incorporation of dopants into the epitaxial film. As an example, the flow of an indium containing source during the MOCVD growth of the GaN-based layers provides a gettering source for carbon that inhibits carbon incorporation in the epitaxial structure.

In some embodiments tri-methyl indium (TMI), tri-ethyl indium (TEI), mixtures of TMI and TEI or other indium precursors, or the like can be utilized as suitable precursors. The presence of indium during epitaxial growth can inhibit carbon incorporation by one or more mechanisms. Without limiting embodiments of the present invention, indium can adhere to the carbon species during growth to prevent carbon from being incorporated into the epitaxial structure. Alternatively, and without limiting embodiments of the present invention, the indium can prevent the carbon from adhering or sticking to the epitaxial growth surface and thereby prevent subsequent incorporation of the carbon species into the GaN-based epitaxial film. These particular mechanisms for reducing carbon incorporation into the epitaxial film are provided as examples of physical mechanisms and are not intended to limit the scope of the present invention. Other mechanisms are included within the scope of the present invention. Additional disclosure related to inhibition of carbon incorporation in epitaxial films is provided in U.S. patent application Ser. No. 13/079,710, filed on Apr. 4, 2011, commonly assigned, and hereby incorporated by reference in its entirety for all purposes.

In a GaN-based layer grown conventionally (i.e., not in the presence of an indium containing gas), carbon may be incorporated to a concentration greater than $10^{16}$ cm$^{-3}$. Carbon concentrations of less than $10^{16}$ cm$^{-3}$ have been observed in GaN-based layers grown in the presence of an indium precursor such as TMI. Accordingly, a GaN-based layer grown in the presence of an indium containing gas may have a carbon concentration less than $5\times10^{17}$ cm$^{-3}$ in some embodiments, less than $1\times10^{17}$ cm$^{-3}$ in some embodiments, less than $1\times10^{16}$ cm$^{-3}$ in some embodiments, less than $5\times10^{15}$ cm$^{-3}$ in some embodiments and less than $1\times10^{15}$ cm$^{-3}$ in some embodiments.

Thus, the presence of an indium containing gas such as TMI or TEI precursor gases during the epitaxial growth of GaN-based layers, for example, the drift layer in a vertical FET, may reduce the carbon background level to less than $1\times10^{17}$ cm$^{-3}$ in some embodiments of the invention, less than $1\times10^{16}$ cm$^{-3}$ in some embodiments of the invention, less than $5\times10^{15}$ cm$^{-3}$ in some embodiments, and less than $1\times10^{14}$ cm$^{-3}$ in some embodiments of the invention, thereby improving the control over the active dopants in the epitaxial structure. It should be noted that a given amount of the gettering material, for example, indium can be incorporated into the nitride crystal grown as a result of the indium precursor bring present during epitaxial growth. Such indium incorporation should not adversely affect the GaN crystal quality. The presence of a gettering material, for example, indium, may be detected by one or more characterization techniques including Secondary Ion Mass Spectrometry (SIMS), or the like. Potential gettering materials include indium containing materials such as TMI or TEI, EDMI (Ethyldimethylindium), aluminum containing materials such as tri-methyl aluminum and tri-ethyl aluminum, combinations thereof, or the like.

In some embodiments, the flow rate for the gettering material, for example, tri-methyl indium is in the range of 0.001 sccm to 100 sccm. Embodiments of the present invention can be contrasted with convention methods for growing InGaN layers, which can be used, for example, in optical devices such as lasers and LEDs. In these conventional methods, typically used for the growth of quantum wells, barrier layers, and carrier/optical confinement layers, the growth temperature used for the growth of the InGaN layers is in the range of 700° C. to 800° C., as appropriate for optical materials and in order to produce significant indium incorporation in the InGaN layers, for example on the order of 20% indium. In contrast with these InGaN layers, embodiments of the present invention grown GaN-based layers at elevated temperatures in the range of 1000° C. to 1200° C., and in an ambient containing hydrogen.

The amount of indium incorporated in the GaN-based layers depends on factors such as the growth temperature, the ratio of gallium precursor gas to indium containing gas, the growth rate, the gas ambient, and the like, but indium concentrations of less than $10^{16}$ cm$^{-3}$ are achieved for GaN-based layers grown in the presence of an indium containing gas. Accordingly, a GaN-based layer grown in the presence of an indium-containing gas may have an indium concentration less than $10^{20}$ cm$^{-3}$ in some embodiments, less than $10^{18}$ cm$^{-3}$ in some embodiments, less than $10^{17}$ cm$^{-3}$ in some embodiments, and less than $10^{16}$ cm$^{-3}$ in some embodiments.

In some embodiments, GaN-based layers are grown at a temperature of at least 800° C., in some embodiments, at least 900° C., in some embodiments, and at least 1000° C., and in some embodiments, at temperatures greater than 1000° C. As an example, the GaN-based layers can be grown with a ratio of indium-containing gas to gallium precursor gas that limits the amount of indium incorporated in the III-nitride crystal. The ratio of indium-containing gas to gallium precursor gas may be, for example, between 1 and 80%. In some embodiments, the GaN-based layer is grown in the presence of hydrogen carrier gas or hydrogen mixed with nitrogen, rather than only nitrogen, particularly at lower growth temperatures such as temperatures less than 1000° C., to limit the amount of indium incorporated in the nitride crystal.

In contrast with the growth temperatures associated with laser and LED growth, embodiments of the present invention grow GaN layers are temperatures in the range of 1000° C. to 1200° C., for example, 1050° C. At these growth temperatures, the indium incorporation resulting from the flow of, for example, TMI, is on the order of $1\times10^{14}$ cm$^{-3}$ to $1\times10^{18}$ cm$^{-3}$. Significantly, the typical carbon incorporation observed at these temperatures is reduced due to the gettering by the indium present during growth. In contrast with optical structures, in which the indium concentration is in a range of a few to tens of percent, the indium incorporation in the GaN layers described herein in found in ranges four to six orders of magnitude below the concentrations in optical structures. Thus, in embodiments of the present invention in which indium is incorporated into GaN-based materials at levels such that the material is properly referred to as GaN doped with or incorporating indium, not InGaN.

It should be noted that according to embodiments of the present invention, the incorporation of indium into the crystal lattice does not have a significant adverse effect on the lattice quality, providing the desired electrical functionality for the epitaxially grown GaN-based layers. Because indium isoelectrically substitutes for gallium in the crystal lattice, it does not act as a donor and has limited electrical activity.

Figure 3:
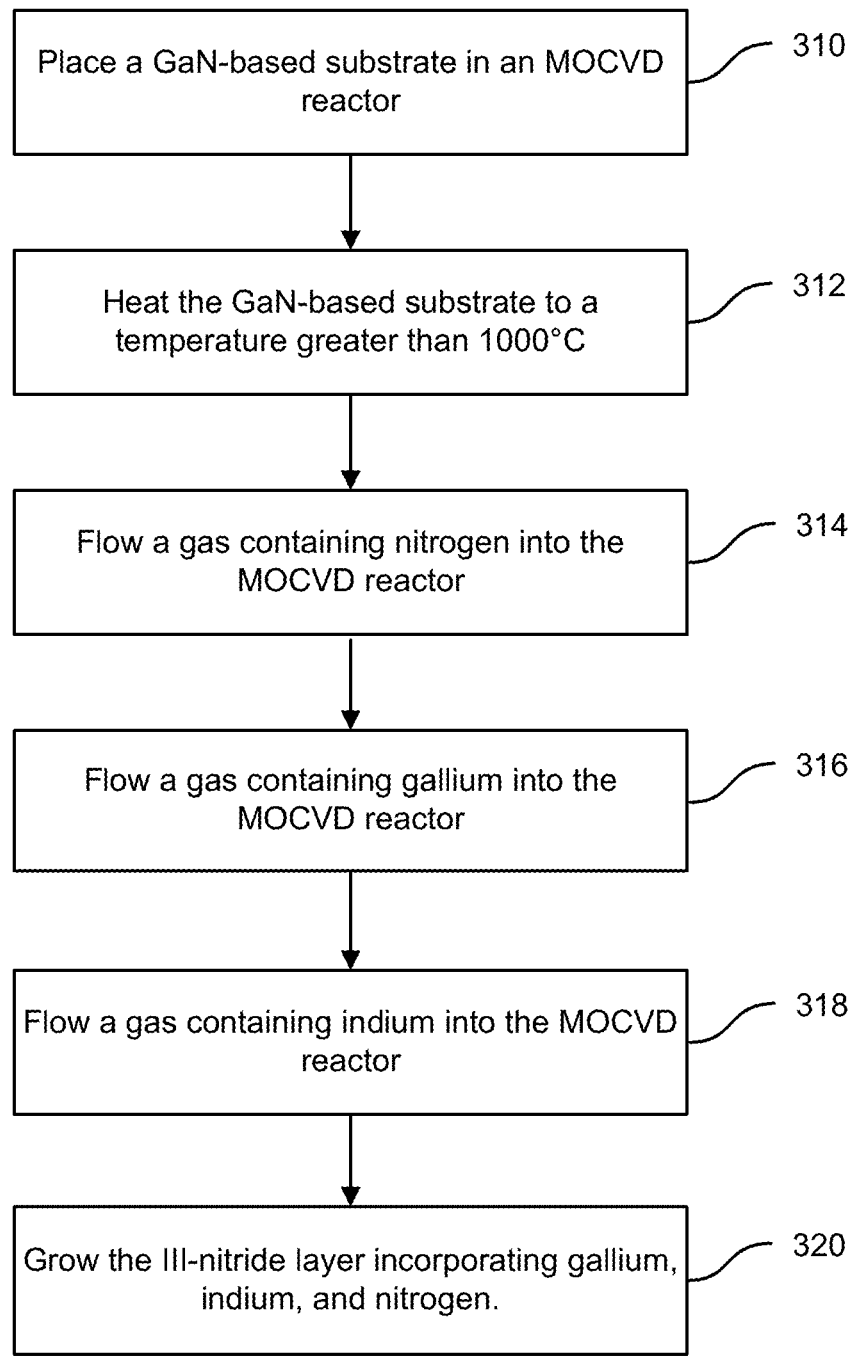
FIG. 3 is a simplified flowchart illustrating a method of fabricating an epitaxial layer with controlled doping according to an embodiment of the present invention.

FIG. 3 is a simplified flowchart illustrating a method of fabricating an epitaxial layer with controlled doping according to an embodiment of the present invention. The method includes placing a GaN-based substrate in an MOCVD reactor (310). The GaN-based substrate can be a doped n-type GaN substrate or other suitable substrate including one or more existing epitaxial layers. The method also includes heating the GaN-based substrate to a temperature greater than 1000° C. (312). In some embodiments, the temperature ranges from about 1000° C. to about 1200° C.

The method further includes flowing a gas containing nitrogen (314), a gas containing gallium (316), and a gas containing indium (318) into the MOCVD reactor. The III-nitride layer is grown incorporating gallium, indium, and nitrogen (320). As an example, the III-nitride layer could be an n-type GaN layer with indium in concentrations ranging from about $1\times10^{14}$ cm$^{-3}$ and $1\times10^{18}$ cm$^{-3}$. Thus, this layer would not be an InGaN alloy layer, but a layer incorporating dopant-level concentrations of indium. As described above, the use of an indium containing gas during growth results in low carbon incorporation, for example, a carbon concentration in the III-nitride epitaxial layer less than $1\times10^{16}$ cm$^{-3}$.

A variety of gases can be utilized during the growth process, including a gas containing nitrogen that includes at least one of ammonia or cracked ammonia, a gas containing gallium that includes at least one of tri-methyl gallium, tri-ethyl gallium, cracked tri-methyl gallium, or cracked tri-ethyl gallium, and a gas containing indium that includes at least one of tri-methyl indium, tri-ethyl indium, cracked tri-methyl indium, or cracked tri-ethyl indium.

It should be appreciated that the specific steps illustrated in FIG. 3 provide a particular method of fabricating an epitaxial layer with controlled doping according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

In some embodiments, a precursor that replaces some or all of the carbon-bearing groups with non-carbon-bearing groups, such as gallium chloride or diethyl gallium chloride, is used instead of or in addition to a typical gallium precursor such as TMG in a process utilizing organic precursors, such as MOCVD. In some embodiments, low doped n-type GaN-based layers are grown with a gallium precursor that is 100% gallium chloride or diethyl gallium chloride, or a mixture of gallium chloride or diethyl gallium chloride and one or both of TEG and TMG. Low doped n-type GaN-based layers grown with gallium chloride or diethyl gallium chloride as all or part of the gallium precursor may have a carbon concentration less than $10^{17}$ cm$^{-3}$ in some embodiments, less than $10^{16}$ cm$^{-3}$ in some embodiments, or less than $10^{15}$ cm$^{-3}$ in some embodiments of the invention.

The various methods for reducing carbon incorporation in III-nitride material may be combined. For example, in some embodiments, GaN is grown using both a precursor that results in less carbon present during growth, such as TEG, gallium chloride, or diethyl gallium chloride, and a material that inhibits carbon from incorporating in the III-nitride crystal, such as an indium-containing gas, as described above.

Figure 4:
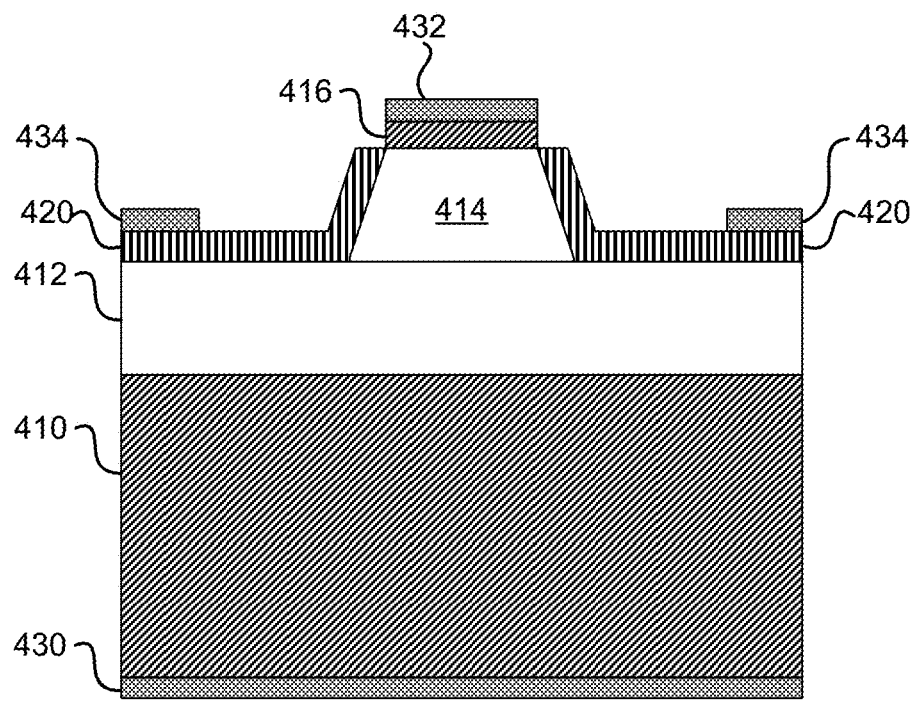
FIG. 4 is a simplified schematic cross-section of vertical junction field effect transistor according to an embodiment of the present invention.

FIG. 4 is a simplified schematic cross-section of vertical junction field effect transistor (JFET) according to an embodiment of the present invention. The vertical JFET is referred to as a vertical device because the current flow through the FET is in a vertical direction that is substantially orthogonal to the growth direction of the various epitaxial layers included in the device.

The JFET 400 includes a III-nitride substrate 410 illustrated as a n-type GaN substrate. An n-type drift layer 412 is illustrated as an n-type GaN epitaxial layer. For high power operation, the thickness of the drift layer is increased in order to support a large breakdown voltage. As illustrated in FIG. 1, layers with thicknesses of tens of microns are suitable for use in the vertical JFET and lower doping enables high voltage operation. In order to reduce the background doping, particularly of carbon, the drift layer is grown in the presence of a gettering material such as indium as described more fully throughout the present specification. In addition to the n-type drift layer, the n-type channel 414 can be grown to include a reduced level of carbon incorporation. A highly doped n-type contact layer 416 is coupled to the n-type channel.

The vertical JFET includes a gate region 420 that is disposed laterally with respect to the channel 414 so that application of bias to the gate results in movement of the depletion regions in a lateral direction, opening up or closing the vertical path for current flow through the channel. Ohmic metals (430, 432, and 434) are deposited and/or patterned to provide electrical contact to the source, drain, and gate, respectively.

Figure 5:
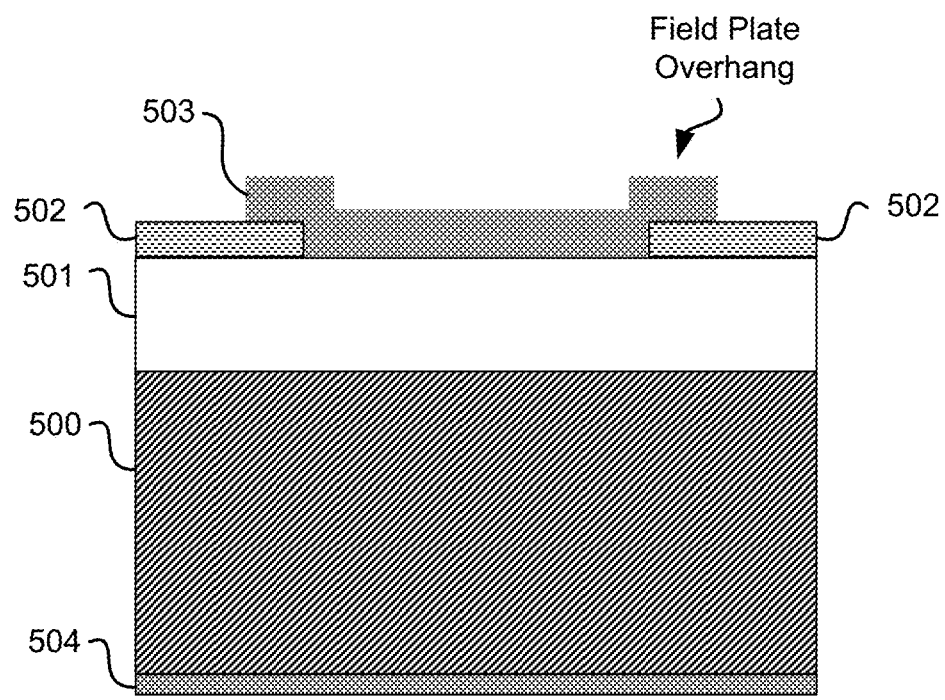
FIG. 5 is a simplified schematic cross-section of a Schottky barrier diode according to an embodiment of the present invention.

FIG. 5 is a simplified schematic cross-section of a Schottky barrier diode according to an embodiment of the present invention. Referring to FIG. 5, a substrate 500 is provided (e.g., an n-type GaN substrate) with an epitaxial layer 501 coupled to the substrate. In the illustrated embodiment, the epitaxial layer 501 is a lightly doped n-type drift layer suitable for use in the Schottky barrier diode. In other embodiments, other epitaxial layers, including multiple layers are utilized. An electrically insulating material 502 such as a dielectric is coupled to the epitaxial layer 501 at predetermined portions of the device. Typically, the insulating material 502 is deposited and patterned to provide openings operable to enable vertical current flow through the device.

A Schottky metal 503 is coupled to the epitaxial layer at portions of the device free of the insulating layer as well, in the illustrated embodiment, at portions of the device overlying a portion of the insulating layer as illustrated at the Field Plate Overhang. An ohmic metal 504 is electrically coupled to the substrate 500. Application of a bias voltage between the ohmic metal 504 and the Schottky metal 503 will result in Schottky diode electrical characteristics as will be evident to one of skill in the art.

The doping control provided by embodiments of the present invention will enable the fabrication of epitaxial layers such as epitaxial layer 501 with improved electrical performance in comparison with conventional techniques. In addition to the illustrated Schottky barrier diode, other embodiments can be used to fabricate epitaxial layers used in P-i-N diodes, merged P-i-N Schottky (MPS) diodes, thyristors, and a number of other transistor and diode variations. One of ordinary skill in the art would recognize many variations, modifications, and alternatives.

Although embodiments of the present invention have been discussed in the context of doping control of drift regions that are vertically defined by epitaxial growth to produce a drift region with a finely controlled low doping level, embodiments of the present invention are not limited to this particular geometry. In another possible configuration, the drift region is laterally defined by device fabrication, for example by gate to drain spacing in a field effect transistor. In another example the drift region includes the substrate, which is appropriately doped. One of ordinary skill in the art would recognize many variations, modifications, and alternatives.

Moreover, although some embodiments of the present invention are illustrated in terms of a vertical FET, such as a vertical JFET, embodiments of the present invention are not limited to this particular device design and the methods and systems described herein are applicable to a wide variety of electrical devices and particularly devices utilizing vertical current flow. For example, epitaxial layers with controllable levels of dopant incorporation are applicable to other vertical or lateral devices utilizing drift layers, semiconductor resistors, isolation regions, or the like. These devices include Schottky diodes and devices integrating the various transistor and diodes described herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A vertical JFET formed by a method comprising:
providing a GaN-based substrate having a surface and a first electrical contact opposing the surface;
forming a GaN-based drift layer coupled to the GaN-based substrate and operable to conduct current in a direction substantially orthogonal to the surface, wherein forming the GaN-based drift layer comprises doping the drift layer with indium to cause the indium concentration of the drift layer to be less than about $1 \times 10^{16}$ cm$^{-3}$ and to cause the carbon concentration of the drift layer to be less than about $1 \times 10^{16}$ cm$^{-3}$; forming an n-type channel layer coupled to the GaN-based drift layer;
forming an n-contact layer coupled to the GaN-based drift layer and substantially parallel to the surface;

forming a second electrical contact electrically coupled to the n-contact layer;

forming a p-type gate region electrically coupled to the n-type channel layer; and forming a third electrical contact electrically coupled to the p-type gate region.

2. The vertical JFET of claim 1, wherein a concentration of indium in the n-type drift layer is between $1\times10^{15}$ cm$^{-3}$ and $1\times10^{16}$ cm$^{-3}$.

3. The vertical JFET of claim 1, wherein a thickness of the n-type drift layer is greater than 1 μm.

4. The vertical JFET of claim 1, wherein the n-type channel layer comprises a GaN layer.

5. The vertical JFET of claim 1, wherein the n-type drift layer comprises an n-type GaN layer.

6. The vertical JFET of claim 1, wherein the GaN-based drift layer is formed by a metal organic chemical vapor deposition (MOCVD) process.

7. The vertical JFET of claim 6, wherein during the MOCVD process, a metalorganic precursor is used.

8. The vertical JFET of claim 1, wherein the GaN-based drift layer is formed in an environment containing at least one of tri-methyl indium (TMI), tri-ethyl indium (TEI), and ethyldimethylindium (EDMI).

9. The vertical JFET of claim 1, wherein the GaN-based drift layer is formed in an environment containing hydrogen.

10. The vertical JFET of claim 1, wherein the GaN-based drift layer is formed at a temperature greater than 1000° C.

11. A method of manufacturing a vertical JFET, the method comprising:

providing a GaN-based substrate having a surface and a first electrical contact opposing the surface;

forming a GaN-based drift layer coupled to the GaN-based substrate and operable to conduct current in a direction substantially orthogonal to the surface, wherein forming the GaN-based drift layer comprises doping the drift layer with indium to cause the indium concentration of the drift layer to be less than about $1\times10^{16}$ cm$^{-3}$ and to cause the carbon concentration of the drift layer to be less than about $1\times10^{16}$ cm$^{-3}$; forming an n-type channel layer coupled to the GaN-based drift layer;

forming an n-contact layer coupled to the GaN-based drift layer and substantially parallel to the surface;

forming a second electrical contact electrically coupled to the n-contact layer;

forming a p-type gate region electrically coupled to the n-type channel layer; and forming a third electrical contact electrically coupled to the p-type gate region.

12. The method of claim 11, wherein a concentration of indium in the n-type drift layer is between $1\times10^{15}$ cm$^{-3}$ and $1\times10^{16}$ cm$^{-3}$.

13. The method of claim 11, wherein a thickness of the n-type drift layer is greater than 1 μm.

14. The method of claim 11, wherein the n-type channel layer comprises a GaN layer.

15. The method of claim 11, wherein the n-type drift layer comprises an n-type GaN layer.

16. The method of claim 11, wherein the GaN-based drift layer is formed by metal a metal organic chemical vapor deposition (MOCVD) process.

17. The method of claim 16, wherein during the MOCVD process, a metalorganic precursor is used.

18. The method of claim 11, wherein the GaN-based drift layer is formed in an environment containing at least one of tri-methyl indium (TMI), tri-ethyl indium (TEI), and ethyldimethylindium (EDMI).

19. The method of claim 11, wherein the GaN-based drift layer is formed in an environment containing hydrogen.

20. The method of claim 11, wherein the GaN-based drift layer is formed at a temperature greater than 1000° C.

* * * * *